United States Patent
Lund et al.

(10) Patent No.: US 11,143,167 B2
(45) Date of Patent: Oct. 12, 2021

(54) ESTIMATING A CHARACTERISTIC OF A WIND TURBINE ELECTRICAL SIGNAL

(71) Applicant: VESTAS WIND SYSTEMS A/S, Aarhus N (DK)

(72) Inventors: Torsten Lund, Fredericia (DK); John Godsk Nielsen, Hornslet (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 73 days.

(21) Appl. No.: 16/472,371

(22) PCT Filed: Oct. 17, 2017

(86) PCT No.: PCT/DK2017/050344
§ 371 (c)(1),
(2) Date: Jun. 21, 2019

(87) PCT Pub. No.: WO2018/113862
PCT Pub. Date: Jun. 28, 2018

(65) Prior Publication Data
US 2019/0360470 A1 Nov. 28, 2019

(30) Foreign Application Priority Data
Dec. 21, 2016 (DK) .............................. PA201671009

(51) Int. Cl.
*F03D 17/00* (2016.01)
(52) U.S. Cl.
CPC .......... *F03D 17/00* (2016.05); *F05B 2220/30* (2013.01); *F05B 2270/337* (2013.01)

(58) Field of Classification Search
CPC .................. F03D 17/00; F05B 2220/30; F05B 2270/337; G01R 19/2509
See application file for complete search history.

(56) References Cited

U.S. PATENT DOCUMENTS

| | | | |
|---|---|---|---|
| 2003/0002299 | A1 | 1/2003 | Trzynadlowski et al. |
| 2006/0023120 | A1 | 2/2006 | Waldner |

(Continued)

FOREIGN PATENT DOCUMENTS

| | | | |
|---|---|---|---|
| EP | 1330036 | A1 | 7/2003 |
| EP | 2966763 | A1 | 1/2016 |

(Continued)

OTHER PUBLICATIONS

Danish Patent and Trademark Office First Technical Examination of Application No. PA 2016 71009 dated May 22, 2017.

(Continued)

*Primary Examiner* — Tulsidas C Patel
*Assistant Examiner* — Joseph Ortega
(74) *Attorney, Agent, or Firm* — Patterson + Sheridan, LLP

(57) ABSTRACT

A method and apparatus for estimating a characteristic of a wind turbine electrical signal comprises buffering a sequence of sample values of the wind turbine electrical signal and a sequence of sample times corresponding with the sequence of sample values. The time periods represented by the sample times are variable. A sub-sequence of the buffered sample values to integrate is determined, based at least in part on a sum of the time periods. The characteristic is estimated by integrating the sample values in the sub-sequence.

19 Claims, 8 Drawing Sheets

(56) References Cited

U.S. PATENT DOCUMENTS

| | | | |
|---|---|---|---|
| 2014/0184273 A1* | 7/2014 | Feizi-Khankandi | ............................ H03M 1/1265 327/91 |
| 2016/0033580 A1* | 2/2016 | Qiao | ..................... F03D 7/0296 324/765.01 |

FOREIGN PATENT DOCUMENTS

| | | |
|---|---|---|
| WO | 2008073528 A1 | 6/2008 |
| WO | 2013006697 A2 | 1/2013 |
| WO | 2018113862 A1 | 6/2018 |

OTHER PUBLICATIONS

PCT International Search Report for Application No. PCT/DK2017050344 dated Jan. 17, 2018.

Qaisar Saeed Mian et al: 11 Computationally efficient adaptive rate sampling and filtering 11 2007 15th European Signal Processing Conference, IEEE, Sep. 3, 2007 (Sep. 3, 2007), pp. 2139-2143.

PCT Written Opinion of the Internatoinal Searching Authority for Application No. PCT/DK2017/050344 dated May 22, 2017.

\* cited by examiner

ESTIMATING A CHARACTERISTIC OF A WIND TURBINE ELECTRICAL SIGNAL

TECHNICAL FIELD

The invention relates to a method and apparatus for estimating a characteristic of a wind turbine electrical output and a wind turbine comprising such an apparatus.

BACKGROUND TO THE INVENTION

Wind turbine generators include power converters that are used to provide a required output, which must account for plant operating parameters, grid conditions and instantaneous demand, from generated power, which is variable in dependence on instantaneous operating conditions.

In some power converters, three-phase generated power is fed to an array of switches that are operated using pulse-width modulated (PWM) control signals to provide a required output.

It is against this background that the invention has been devised.

SUMMARY OF THE INVENTION

An aspect of the invention provides a method of estimating a characteristic of a wind turbine electrical signal, the method comprising:
  buffering a sequence of sample values of the wind turbine electrical signal;
  buffering a sequence of sample times corresponding with the sequence of sample values, wherein the time periods represented by the sample times are variable;
  determining a sub-sequence of the buffered sample values to integrate, based at least in part on a sum of the corresponding time periods; and
  estimating the characteristic by integrating the sample values in the sub-sequence.

The sum of the corresponding time periods may not exceed an integration period for which the characteristic is to be estimated.

The time periods represented by the sample times may vary randomly, pseudo-randomly, or in accordance with a predetermined pattern.

Integrating the sample values may comprise weighting each of the sample values within the sub-sequence based on the time period corresponding to that sample value's sample time.

Buffering the sequences of sample values and corresponding sample times may comprise repeatedly:
  determining one of the sample values and determining a sample time corresponding with the determined sample value; and
  adding the determined sample value and the corresponding sample time to one or more buffers;
  wherein determining the sub-sequence may comprise, for each determined sample value and determined sample time added to the one or more buffers:
  (a) updating a time integrator by adding a time period represented by the determined sample time thereto; and
  (b) when the value of the time integrator exceeds the integration period:
    (i) removing an oldest sample value and corresponding oldest sample time from the one or more buffers;
    (ii) subtracting the time period corresponding to the oldest sample time from the time integrator; and
    (iii) repeating steps (i) and (ii) until the value of the time integrator no longer exceeds the integration period.

The sub-sequence of the sample values to integrate may be determined such that a sum of the time periods represented by the sample times associated with the sub-sequence is maximised without exceeding the integration period.

The characteristic of a wind turbine electrical signal may be estimated over several integration periods, wherein the integration periods may be variable.

The sequence of sample values and the sequence of sample times may be buffered in one or more buffers.

A forward pointer may be maintained, indicative of a position, in the one or more buffers, of a latest sample value and sample time.

A rear pointer may be maintained, indicative of a position, in the buffer, of a rear sample value and a rear sample time, the rear sample value being older than the latest sample value and the rear sample time being older than the latest sample time.

The one or more buffers may be circular buffers.

The one or more buffers may be at least as long as a ratio of the longest possible integration period and the shortest possible time period.

The electrical signal that is sampled may be one of the following: a current output from an electrical generator of the wind turbine; a current output from a power converter of the wind turbine; a grid current; a voltage output of the electrical generator; a voltage output of the power converter; and a grid voltage.

The characteristic may be one of the following: positive and/or negative sequence voltages for use in control of a power converter of the wind turbine; an RMS voltage and/or current and/or power of a fundamental frequency of the power converter or an electrical generator of the wind turbine; an RMS voltage and/or current and/or power of a harmonic frequency of the power converter of the electrical generator.

A further aspect of the invention provides a method of estimating a characteristic of a wind turbine electrical signal, the method comprising:
  (i) sampling a wind turbine electrical signal to determine a sample value;
  (ii) buffering the sample value, and a sample time associated with the sample value, at one or more buffer addresses of one or more buffers, the one or more buffer addresses being based on a value of a front counter;
  (iii) adding, to a time integrator, a time period associated with the sample time, the time integrator representing a total of the time periods associated with a sub-sequence of the buffered sample values, the sub-sequence being defined by a buffer address based on the value of the front counter and a buffer address based on the value of rear counter;
  (iv) adjusting a value of the rear counter to adjust a length of the sub-sequence and updating the time integrator in dependence on the adjusted value of the rear counter;
  (v) integrating the sample values in the sub-sequence;
  (vi) incrementing the front counter; and
  (vii) repeating steps (i)-(vi);
  wherein the time periods associated with the sample times are variable.

Integrating the sample values may include maintaining a sample integrator comprising a sum of sample values corresponding to the sub-sequence.

The one or more buffers may be circular.

Adjusting the rear counter may comprise adjusting the value of the rear counter to reduce the length of the subsequence. The time integrator may be updated in dependence on the adjusted value of the rear counter by subtracting, from the time integrator, the time period associated with the or each sample value that is removed from the sub-sequence as a result of adjusting the rear counter.

Adjusting the rear counter may comprise adjusting the value of the rear counter to increase the length of the sub-sequence. The time integrator may be updated in dependence on the adjusted value of the rear counter comprises adding, to the time integrator, the time period associated with the or each sample value that is added to the sub-sequence as a result of adjusting the rear counter.

A further aspect of the invention provides apparatus for estimating a characteristic of a wind turbine electrical signal, the apparatus comprising:
at least one processor;
a memory operatively coupled to the at least one processor, the memory storing instructions that, when executed, implement the method of any of the aspects of the invention set out above.

A further aspect of the invention provides a wind turbine comprising at least one wind turbine generator and an apparatus according to the previously set out aspect of the invention.

BRIEF DESCRIPTION OF THE DRAWINGS

The invention will now be described, by way of example only, with reference to the accompanying drawings, in which.

DETAILED DESCRIPTION OF EMBODIMENTS OF THE INVENTION

As described below, embodiments of the invention provide methods for estimating a characteristic of a wind turbine electrical signal. The characteristic may be, for example, one or more of positive and/or negative sequence voltages/currents for use in control of a power converter of the wind turbine; a Root Mean Square (RMS) voltage and/or current and/or power of a fundamental frequency of the power converter or an electrical generator of the wind turbine; an RMS voltage and/or current and/or power of a harmonic frequency of the power converter of the electrical generator. These characteristics are merely examples, and the skilled person will appreciate that other characteristics may be estimated.

Figure 1:
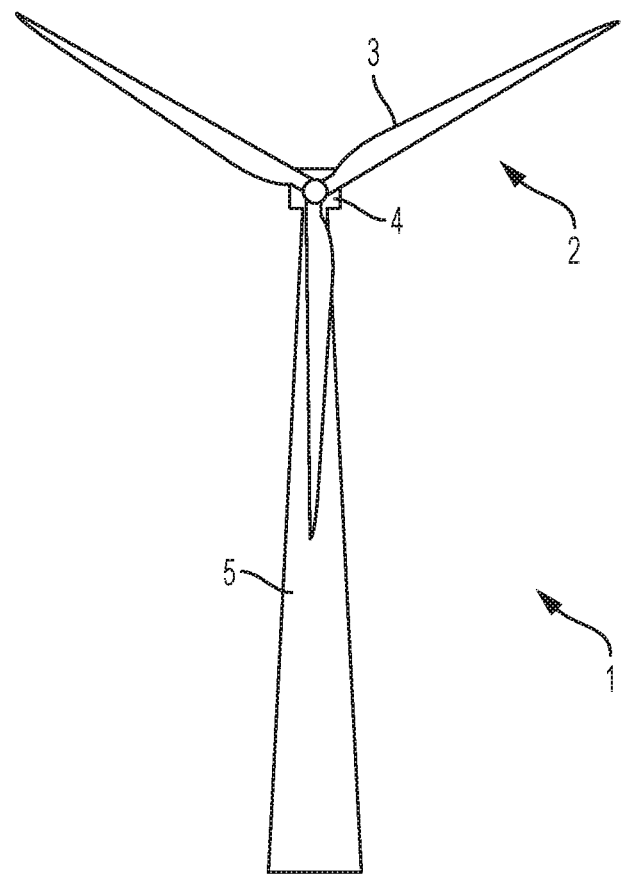
FIG. 1 is a schematic diagram of a full-scale converter-based wind turbine generator that is suitable for use with embodiments of the invention.

To provide context for the invention, an example of a wind turbine generator 1 to which such methods may be applied is shown in FIG. 1.

It should be appreciated that the wind turbine generator 1 of FIG. 1 is referred to here by way of example only, and embodiments of the invention may be implemented in many different types of wind turbine systems.

The wind turbine generator 1 shown is a three-bladed upwind horizontal-axis wind turbine (HAWT), which is the most common type of turbine in use. The wind turbine generator 1 comprises a turbine rotor 2 having three blades 3, the rotor 2 being supported at the front of a nacelle 4 in the usual way. It is noted that although three blades is common, different numbers of blades may be used in alternative embodiments. The nacelle 4 is in turn mounted at the top of a support tower 5, which is secured to a foundation (not shown) that is embedded in the ground.

The nacelle 4 contains a generator (not shown in FIG. 1) that is driven by the rotor 2 to produce electrical energy. Thus, the wind turbine generator 1 is able to generate power from a flow of wind passing through the swept area of the rotor 2 causing the rotation of the blades 3.

Figure 2:
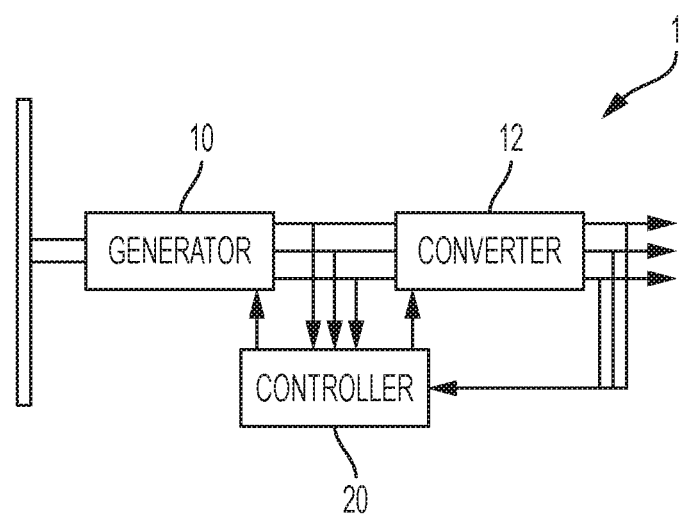
FIG. 2 is a block diagram of an architecture of the wind turbine generator of FIG. 1.

FIG. 2 is a block diagram representation of the architecture of the wind turbine generator 1 of FIG. 1. The example shown is representative only and the skilled reader will appreciate that the methods described below may be applicable to many different configurations.

As already noted, the wind turbine generator 1 comprises an electrical generator 10 that is driven by the rotor 2 to produce electrical power. The power produced in the electrical generator 10 is three-phase AC, but is not in a form suitable for delivery to the grid, in particular because it is typically not at the correct frequency or phase angle. This is because the frequency and phase angle of the generated power are determined, at least in part, by the speed of rotation of the rotor 2, which in turn is dependent on wind conditions.

Accordingly, the wind turbine generator 1 includes a power converter 12 to process the electrical power produced by the electrical generator 10 into a suitable output waveform having the same frequency as the grid and the appropriate phase angle. In general terms, therefore, the power converter 12 provides AC to AC conversion, which it achieves by feeding electrical current through an AC-DC converter followed by a DC-AC converter in series.

Figure 3:
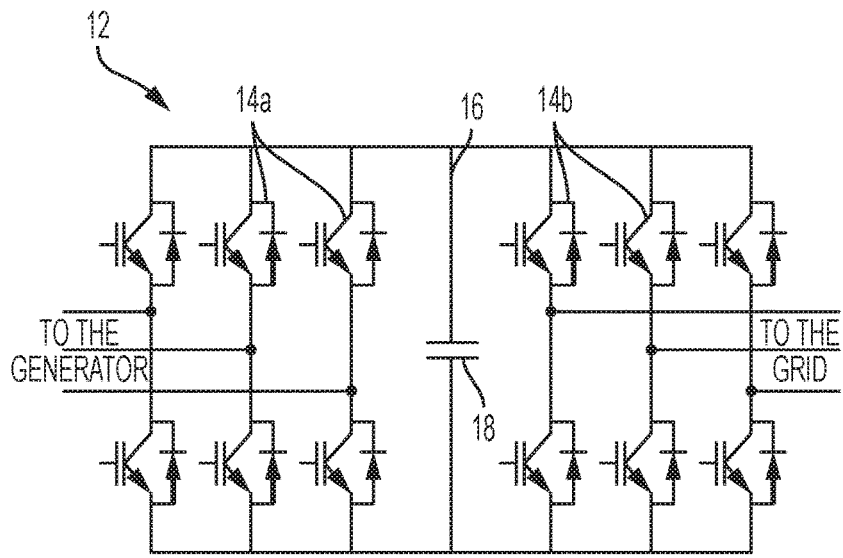
FIG. 3 is a schematic diagram showing an architecture of a converter of the wind turbine generator of FIG. 1.

An example of a suitable power converter 12 is shown in more detail in FIG. 3. The power converter 12 comprises an array of insulated gate bi-polar transistors (IGBTs) 14a, 14b, each of which outputs a voltage that is controlled using a respective PWM control signal, with the output voltage being proportional to a duty cycle of the control signal. The IGBTs 14a, 14b are arranged in two groups of six in a symmetrical configuration: a generator-side group 14a, which provides AC-DC conversion; and a grid-side group 14b, which provides DC-AC conversion. The two groups of IGBTs 14a, 14b are connected by a DC link 16 that includes a shunt capacitor 18 for smoothing the output from the generator-side IGBTs 14a.

Each phase of the input power received from the generator 10 is connected to a pair of opposed IGBTs 14a, which then connect to respective opposing branches of the DC link. Through appropriate control of the frequency and duty cycle of the PWM control signals that are used to control the outputs from the IGBTs 14*a*, a desired DC output can be delivered to the DC link from the generator-side IGBTs 14*a*.

At the grid side, the DC output supplied through the DC link is received by a respective pair of IGBTs 14*b* for each phase of the three-phase output. The DC signal delivered through the DC link can be reconstructed into a three-phase AC output of desired characteristics, to meet instantaneous demand, by controlling the PWM signals supplied to the grid-side IGBTs 14*b* appropriately.

Returning to FIG. 2, a control system 20 is provided that implements feedback-loop control for each component of the wind turbine generator 1 to control the output from the converter 12. The control system includes one or more controllers that act based on sample data obtained by a sampling system.

In FIG. 2, a single controller 20 is shown for simplicity. However, the skilled reader will appreciate that in practice it is common to use distributed control systems, in which each element of the wind turbine generator 1 has a respective controller.

The sampling system probes the wind turbine generator 1 at various stages to sample electrical signals that are indicative of current or voltage, for example. In particular, the sampling system gathers raw data relating to the current and voltage of the outputs from the electrical generator 10 on the generator side, and from the power converter 12 on the grid side. As shall be described later, this raw data is processed into sample data, which is then passed to the controller. The controller uses the sample data to determine operating parameters for the wind turbine generator 1. For example, the duty cycle of the control signals for the generator-side IGBTs 14*a* of the power converter 12 may be determined, at least in part, based on the instantaneous properties of the generated power supplied by the electrical generator 10.

Under certain operating conditions, the noise produced in the converter may become unacceptable. This is especially the case when the carrier frequency remains steady at a level that tends to produce harmonics at a corresponding constant frequency, which manifest as continuous monotone noise, or 'tones', emitted by the converter. Tones are known to be particularly stress-inducing for any individual close to the converter, and so are undesirable.

Some frequencies generate noise of significantly higher magnitude than is caused by neighbouring frequencies, a phenomenon that is analogous to resonance, and tonal audibility or tonality is a measurement of the amplitude of noise at a particular frequency compared with at its neighbouring frequencies.

One way to combat this is to vary the carrier frequency of the PWM control signals, which in turn avoids production of harmonics associated with tonal noise. Varying the carrier frequency of the PWM control signals randomly—a technique known as 'random pulse width modulation', or 'random PWM'—can reduce tonal audibility from power converters. As the skilled reader will be aware, conventional controllers are capable of implementing random PWM, and so this is not described any further here.

It is noted that random PWM need not be truly random, and the term is used to encompass a range of ways in which the carrier frequency of a PWM signal may be varied, for example according to a repeating pattern.

It has previously been difficult to implement random or otherwise variable PWM into power generation systems, as the varying switching frequency causes problems with feedback loop control of system components, and in particular with interfacing to components of the system such as the electric generator 10. For example, most discrete time signal processing algorithms assume that the interval between sampling instances is time invariant. However, in applications such as random PWM and synchronised PWM, it may be advantageous to synchronise the sampling frequency with the PWM frequency. This means that the sampling interval may vary within a single alternating current (AC) period. Some AC quantities such as Root Mean Square (RMS) or positive sequence require a sliding average over a whole AC period. When both the sampling frequency and the AC frequency are varying, the calculation must take this into account. For real time systems, the processing required must be kept low to avoid overloading the processor.

With that context established, an approach for estimating a characteristic of a wind turbine electrical signal will now be described. Typically, the method will be performed in a processor forming part of, or at least in communication with, the controller 20. The method may be implemented in software instructions stored in a memory for execution by such a processor.

Figure 4:
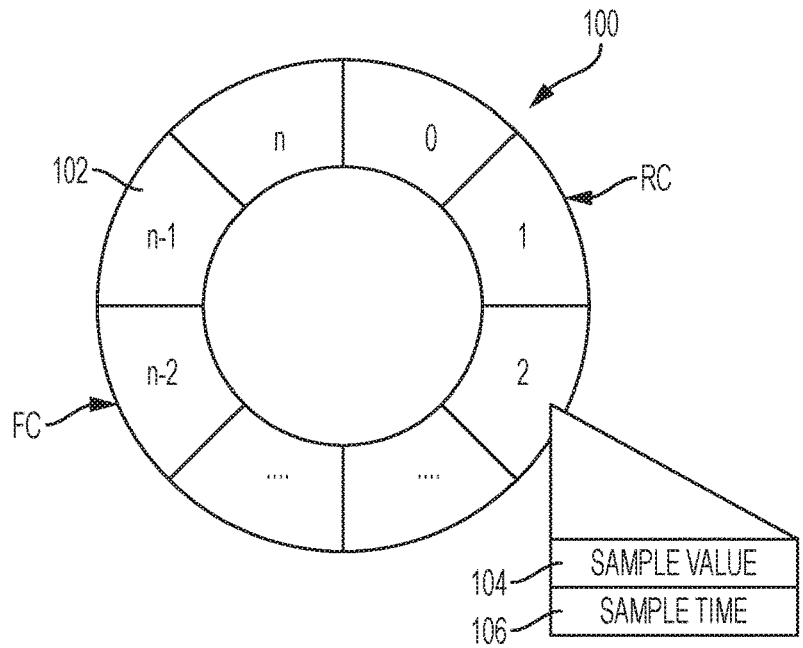
FIG. 4 is schematic of a buffer suitable for use with embodiments of the invention.

Turning to FIG. 4, a buffer 100 is shown. In the illustrated example, the buffer is a circular buffer with n addresses 102 for holding information. The minimum number for n may be determined based on the application. For example, when applied to the output of the converter 12 with an AC frequency of 50 Hz and using a fixed sampling rate of 8 kHz, a buffer with 160 addresses (8 kHz/50 Hz) is sufficient. With a variable sampling rate and/or a variable AC frequency (eg, when applied to the output of the generator 10), the minimum number of addresses may be larger or smaller.

In the illustrated example, each address 102 holds two pieces of information: a sample value 104 of a wind turbine electrical signal and a sample time 106 corresponding with that sample value. This information may be stored separately or in concatenated form, for example. Alternatively, two separate buffers may be maintained: one for the sample values 104 and another for the sample times 106. The skilled person will appreciate that these alternatives are equivalent to each other.

Each sample value 104 may represent, for example, an instantaneous current measured at an output of the generator 10 or the converter 12. The skilled person will appreciate that the sample value may represent other values, such as a voltage output of the generator 10 or the converter 12. Alternatively, the sample value may represent a combination of any such values, and/or may be scaled, filtered, quantised or otherwise processed.

Each sample time 106 may be a time period (ie, a length of time) related to the sampling period of the corresponding sample value 104. In other embodiments, the sample time may represent an actual chronological time, either in a time format (eg, in 24 hour format: 22:12:87.03) or a numerical format representative of that time (eg, in accordance with an operating system or software standard, which allows for representation of an absolute time as a single number). The differences between chronological times corresponding to particular sample values 104 can be used to determine the time between the sampling of those sample values. For example, by taking the difference between the sample times 106 corresponding to adjacent sample values 104, the time between the taking of those sample values 104 may be determined.

The rest of the description will be based on the sample time 106 representing a time period. It will be appreciated that there are a number of ways in which this time period may be characterised. For example, if the instantaneous sampling frequency is known at the time a particular sample value 104 is determined, taking the inverse of that sampling frequency will give the nominal sample interval for that sample value 104, which may in turn be used as the sample time 106. Alternatively, the sample time 106 may be determined as an average or otherwise filtered version of two or more adjacent nominal sample intervals. For example, the sample time 106 for a current sample value 104 may be calculated as an average of the corresponding nominal sample interval and the nominal sample interval for the preceding sample value. The skilled person will appreciate that there are other possibilities for determining a sample time 106 for each sample value 104.

A front counter (FC) 108 is maintained. The front counter 108 is effectively a pointer to a front address in the buffer 100 at which the next sample value 104 and sample time 106 will be stored. As described in more detail below, the front counter 108 may be incremented with each sample value 104 and sample time 106 that is stored in the buffer. In FIG. 4, the front counter address is (n−2).

A rear counter (RC) 110 is maintained. The rear counter 110 is effectively a pointer to a rear address in the buffer 100. As described in more detail below, the rear address represents an oldest sample value 104 and sample time 106 that are considered when estimating the characteristic at any given instance. Depending upon the implementation, the rear counter 110 may be incremented each time the front counter 110 is incremented. This approach may be particularly advantageous when the sample times 106 are of no or low variability, as fewer comparison operations may be required. Irrespective of whether the rear counter 110 is incremented each time the front counter 110 is incremented, the rear counter 110 is adjusted to maintain the value of the time integrator as described below. In FIG. 4, the rear counter address is (1).

A time integrator 112 is maintained. The time integrator 112 represents a sum of all the time periods associated with the sample times 106 corresponding with the sample values stored at addresses in the buffer 100 between the front counter 108 and the rear counter 110, inclusive. In FIG. 4, the value of the time integrator is $(T_1+T_2+ \ldots T_{n-2})$.

Figure 5:
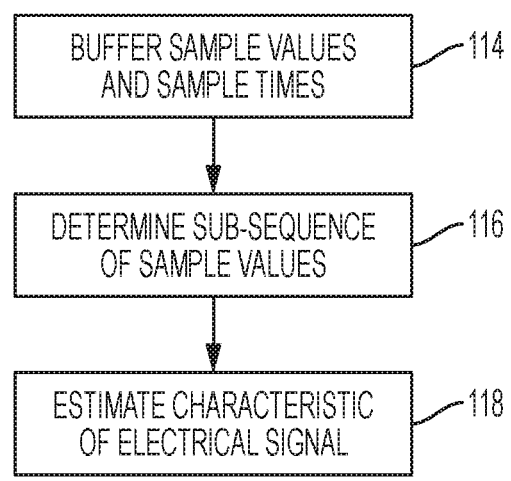
FIG. 5 is a flowchart showing steps of an embodiment of the invention.

Turning to the flowchart of FIG. 5, an embodiment of a method of estimating a characteristic of a wind turbine electrical signal will now be described. A sequence of sample values 104 of the wind turbine electrical signal, and corresponding sample times 106, are buffered 114 in the buffer 100. As each sample value 104 becomes available, it and its associated sample time 106 are stored in the buffer 100 at the address indicated by the front counter 108. The front counter 108 is incremented for each sample value 104, so each new sample value 104 and its corresponding sample time 106 is stored at the next available address in the buffer 100. In this way, a sequence of the sample values 104 and sample times 106 are buffered in the buffer 100.

After each current sample value 104 and sample time 106 has been stored, a sub-sequence of the buffered sample values 104 to integrate is determined 116. In some embodiments, the sub-sequence is determined such that a sum of the time periods represented by the sample times 106 of the sub-sequence does not exceed an integration period for which the characteristic is to be estimated. In some embodiments, the integration period is the period of a full cycle of the waveform that is being sampled. As described above, this period may be variable from cycle to cycle. This is particularly the case where the electrical signal for which the characteristic is being measured is the output of the generator 10, since the frequency of this signal is proportional to the varying rotational speed of the wind turbine rotor 2 that drives the generator (whether via direct drive or an intermediate gearbox). For a grid-tied waveform, such as that at the output of the converter 12, the frequency varies more slowly, and so a longer average may be used. A Phase Locked Loop (PLL) may be used to track the signal frequency, from which the waveform period may be determined by taking the frequency's reciprocal. In some situations, stability and performance may be improved by avoiding tracking instantaneous changes in frequency too closely.

The determining step 116 may include several sub-steps. In one embodiment, for each new sample value 104, the time period associated with the corresponding sample time 106 is added to the time integrator 112. Where the sample time 106 is itself a time period (rather than a point in time as discussed above), then effectively the sample time 106 itself is added to the time integrator 112. As mentioned above, the time integrator 112 represents a sum of all the time periods associated with the sample times 106 corresponding with the sample values 104 stored at addresses in the buffer between the front counter 108 and the rear counter 110, inclusive.

The next sub-step in the determining step 116 is to determine whether the value of the time integrator 112 exceeds the period of the waveform being sampled. Because of the varying sample interval and waveform period, the total time over which the characteristic is being estimated (represented by the value of the time integrator 112) may not match the period of the current waveform.

Figure 7:
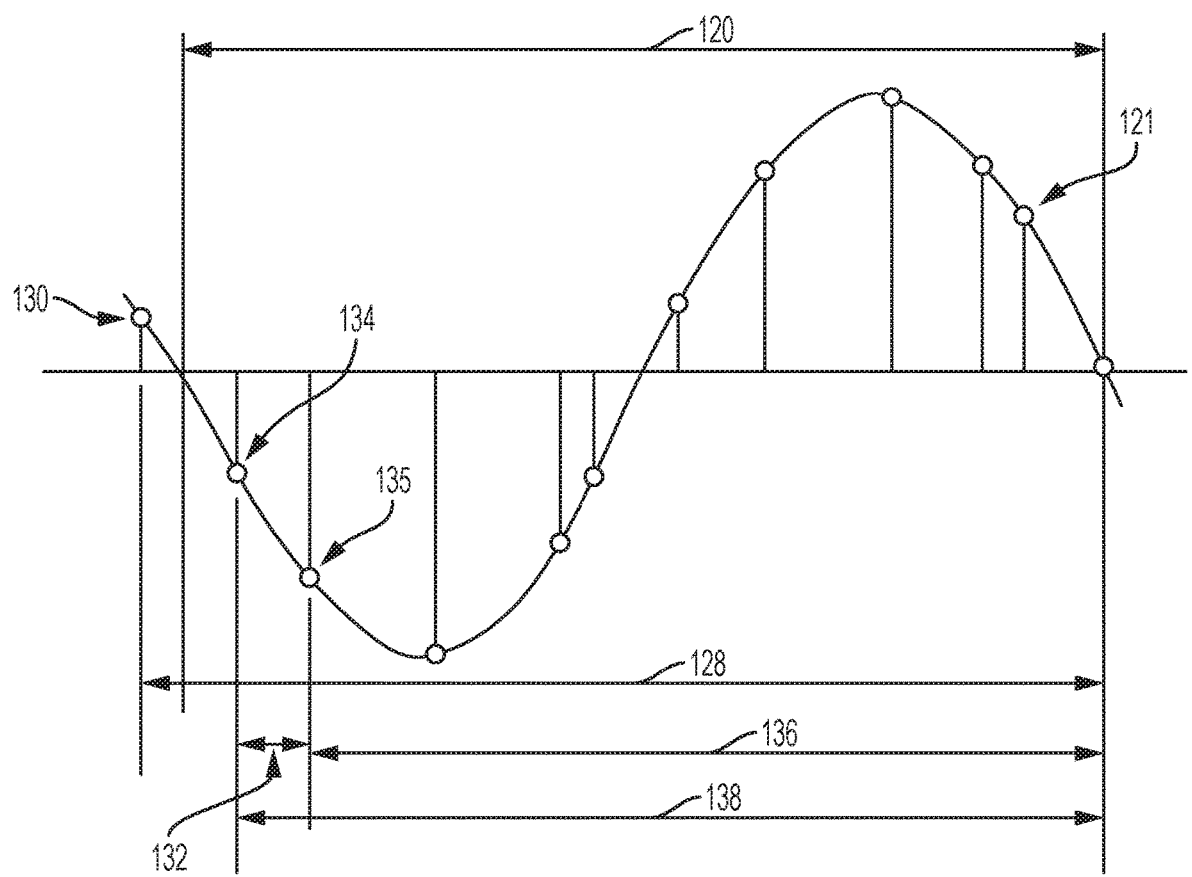
FIG. 7 shows a waveform representing an electronic signal of a wind turbine.

Referring to FIG. 7, there are three possibilities for the relationship between the value of the time integrator 112 (ie, the time period represented by the current sub-sequence) and the period 120 of the waveform being sampled. The first possibility is that the value of time integrator 112 exceeds the length of the current waveform period 120. The value of the time integrator 112 in this situation is indicated as period 128 in FIG. 7, the magnitude of which corresponds to the sum of the sample times corresponding with the sub-sequence of sample values ending with the current sample value 121. Using the period 128 will result in a relatively inaccurate estimate of the characteristic of the electrical signal, because there will be a contribution from the sample 130 outside the current integration period.

The second possibility is that the value of the time integrator 112 is smaller than the period 120 of the waveform being sampled by more than a sample time 132 corresponding with the first sample value 134 outside the current sub-sequence. The value of the time integrator in this situation is indicated as period 136 in FIG. 7. Using the period 136 will result in a relatively inaccurate estimate of the characteristic of the electrical signal, because the contribution from sample 134 will be absent from the calculation.

The third possibility is that the value of time integrator 112 is the maximum possible sum of the sub-sequence without exceeding the length of the current waveform period 120. The value of the time integrator 112 in this situation is indicated as period 138 in FIG. 7. It can be seen that adding to the time integrator 112 the sample time 106 corresponding to the next oldest sample value 130 would result in the value of the time integrator 112 exceeding the period 120 of the waveform being sampled, as in the first possibility discussed above. It can also be seen that removing from the time integrator 112 the sample time 106 corresponding to the oldest sample value 134 would result in the characteristic being estimated over a smaller proportion of the period 124 of the waveform being sampled, as in the second possibility discussed above. Since less of the waveform is being sampled, the characteristic will be estimated with less accuracy than is achieved with the sub-sequence 120.

It will be appreciated that in the example shown in FIG. 7, only a single sample value needed to be subtracted from or added to the sub-sequence. In certain circumstances two or more samples may need to be subtracted from or added to the sub-sequence.

The next sub-step in the determining step 116 is to adjust, if necessary, the length of the sub-sequence such that a sum of the time periods represented by the sample times of the sub-sequence does not exceed an integration period for which the characteristic is to be estimated. If it is determined in the previous sub-step that the third possibility above applies (that is, the value of time integrator 112 is the maximum possible sum of the sub-sequence without exceeding the length of the current waveform period), then no adjustment to the length of the sub-sequence is required. This is because when the third possibility applies, the maximum amount of information will be considered in the estimating step described below, without exceeding the period of the current waveform.

If it is determined in the previous sub-step that the first possibility above applies (that is, the value of time integrator 112 exceeds the length of the current waveform period), then the length of the sub-sequence may be reduced. Where a rear counter 110 is employed, as in the currently described embodiment, this reduction may be achieved by incrementing the rear counter 110. The effect of incrementing the rear counter 110 is to reduce the length of the sub-sequence by removing the oldest sample value 130 and its corresponding sample time. The sample time corresponding with the removed sample value 130 is subtracted from the time integrator 112. The new value of the time integrator 112 is then compared with the period of the current waveform. If the new value exceeds the period of the current waveform, then the process of incrementing the rear counter 110, updating the time integrator 112 and comparing the new value of the time integrator 112 with the period of the current waveform may be repeated until the comparison shows that the new value does not exceed the period of the current waveform. At this point, no further adjustments to the rear counter are needed, and the next step of estimating the characteristic can be taken as described below.

If it is determined in the previous sub-step that the second possibility above applies (that is, the value of time integrator 112 is smaller than the period 124 of the waveform being sampled by more than the sample time 132 corresponding with the first sample value 134 outside the current sub-sequence), then the length of the sub-sequence may be increased. Where a rear counter 110 is employed, as in the currently described embodiment, this increase may be achieved by decrementing the rear counter 110. The effect of decrementing the rear counter 110 is to increase the length of the sub-sequence by effectively adding the sample time 132 corresponding with the first sample value 134. The sample time 132 is added to the time integrator 112. The new value of the time integrator 112 is then compared with the period of the current waveform. If the new value still does not exceed the period of the current waveform, then the process of decrementing the rear counter 110, updating the time integrator 112 and comparing the new value of the time integrator 112 with the period of the current waveform may be repeated. The process may repeat until the new value of the time integrator 112 first exceeds the period of the current waveform. At this point, the rear counter 110 is pointing to the sample value 104 and corresponding sample time 106 that resulted in the time integrator 112 exceeding the period of the current waveform. The rear counter 110 is therefore incremented once, which effectively removes that sample value 104 and its corresponding sample time 106 from consideration, thereby bringing the value of the time integrator 112 below the period of the current waveform. At this point, no further adjustments to the rear counter are needed, and the next step of estimating the characteristic can be taken as described below.

The skilled person will appreciate that maximising the number of sample values without the value of the time integrator exceeding that of the waveform period is only one possible approach to determining the subsequence. For example, similar results may be achieved on average if the subsequence is based on the sub-sequence of sample values that includes the sample that causes the value of the time integrator 112 to exceed waveform period (ie, sample 130 in FIG. 7).

The skilled person will note that, depending on the choice of possible sample times and cycle periods, the sum of the sample times 106 in the sub-sequence may not add up to exactly the length of the waveform period. In that case, it may be desirable to include in the calculations a proportion of the contribution from the sample (eg, sample 130) that causes the time integrator 112 to exceed the waveform period. For example, in FIG. 7, slightly more than half of the integration period corresponding with sample value 130 falls within the waveform period 120. The contribution from that portion may be estimated by any suitable mechanism. For example, the trapezoidal rule may be applied in a manner known to the skilled person. Where the sampling is based on resampling of a higher sampling rate raw data (see below), some or all of the higher frequency samples for this integration period associated with the sample 130 may be used to improve the accuracy of the estimate.

In yet other embodiments, greater or fewer sample values may be considered where accuracy is traded off for computational efficiency. For example, the sub-sequence may include one, two, three or more samples fewer or less than that required to maximise the number of samples without the value of the time integrator 112 exceeding the waveform period.

Once it has been determined which sample values 104 (or portions thereof) are to be considered, the next step is to estimate 118 the characteristic by integrating the sample values 104 in the sub-sequence. The form of integration will depend on the characteristic that is being estimated. For example, if the characteristic is RMS voltage, then integration will include applying the relevant calculations for that characteristic (which are well known those skilled in the art) to the sample values 104 of the sub-sequence. Those sample values 104 are stored at addresses in the buffer between the front counter 108 and the rear counter 110, inclusive.

Before integrating the sample values 104, they may be weighted based on their corresponding sample times 106. This at least partly accounts for the varying interval between samples due to the sample times varying across the waveform period. Sample values 104 associated with a relatively long sample time 106 will be weighted more heavily than those with a relatively short sample time 106. The weighting may be, for example, linear. In one embodiment, weighting the sample values 104 comprises multiplying each sample value 104 by its corresponding sample time 106 prior to performing the integration. In other embodiments, trapezoidal integration may be employed, which may improve accuracy.

Integrating the sample values 104 may be performed recursively. For example, the value of a signal integrator may be updated as each new sample value 104 is added to the buffer. Older sample values 104 (or processed versions thereof) may be added to or subtracted from the signal integrator as the rear counter 110 is respectively decremented or incremented. This method works particularly well when the estimating step 118 involves the summing of the sample values 104, or the summing of processed versions of the sample values 104. For example, if the estimating 118 includes squaring and then summing the sample values 104, the signal integrator may maintain a sum of the squares of the sample values 104 in the sub-sequence.

The skilled person will appreciate that rounding errors may be introduced where recursion and floating point processing are employed in maintaining the signal integrator. This may be avoided by using integer type processing with appropriate scaling. Alternatively, a floating point approach that includes compensation for lower-order bits that would otherwise be lost may be employed, such as a Kahan summation. The mathematics of such algorithms is well-understood by the skilled person and so will not be described in more detail here.

The sample times 106 (or the time periods that correspond to them, where relevant) may vary randomly, pseudo-randomly, or in accordance with a predetermined pattern. The varying may, for example, be chosen so as to reduce audible tones resulting from a harmonic relationship between the sampling frequency and the waveform being sampled. There are various ways in which the sample times may be randomised. For example, a random number generator with seeding may be used online to provide a real-time sequence of sample times (or corresponding periods, where relevant). Alternatively, a random sequence of samples times (or corresponding periods, where relevant) may be calculated offline in advance. More than one sequence may be determined in advance to be used in different operating modes. The latter approach has the benefit of reducing consumption of processing resources within the controller. This approach also allows for optimisation of the sequence of sample times (or periods) where a particular outcome, such as a reduction or cancellation of tonal audibility, is desired.

As already noted, the variation in sample times may not be truly random, and may instead utilise a repeating sequence of random or pseudo-random values, for example. Another possibility is to use a discrete set of sample times, and switch between those values either randomly or according to a defined sequence. For example, at least five values may be used.

The characteristics of the sample times as a whole can be constrained so as to satisfy requirements for features such as a time distribution function, frequency spectra and time drift.

Similarly, the integration period (ie, the period of the waveform) may vary. When a characteristic of the generator output is being estimated, the integration period may vary due to changes in rotation speed of the wind turbine rotor 2. When a characteristic of the converter 12 is being estimated, the integration period may vary only slowly and by a small amount due to being locked to the power grid. It may therefore be tracked with a slow averaging algorithm, such as a PLL with long time constant, or treated as being constant.

Although the buffer 100 has been described as circular, other types of buffer may be used. For example, the buffer may simply be a random access memory under the control of a memory controller and/or processor. Whether circular or not, the buffer may be physical (eg, hard-wired register or section of physical memory) or virtual (eg, established in software and/or controlled by a memory controller).

When the buffer 100 is circular (or otherwise involves modulo or wraparound behaviour) it may be at least as long as a ratio of the longest possible integration period and the shortest possible time period. This ensures that it will always be possible to make the sample times 106 of the sub-sequence long enough to cover the entire waveform period (except for a residual period that is smaller than the shortest possible time period). Alternatively, the mechanism for establishing the varying sample times may ensure that an excessive number of short sample times is not used within a waveform period.

As explained above, the electrical signal that is sampled may be one of the following: a current output from an electrical generator of the wind turbine; a current output from a power converter of the wind turbine; a grid current; a voltage output of the electrical generator; a voltage output of the power converter; and a grid voltage. The characteristic may be one of the following: positive and/or negative sequence voltages for use in control of a power converter of the wind turbine; an RMS voltage and/or current and/or power of a fundamental frequency of the power converter or an electrical generator of the wind turbine; an RMS voltage and/or current and/or power of a harmonic frequency of the power converter of the electrical generator.

The skilled person will understand that instead of changing a sampling rate to vary the sample times, an alternative approach is to sample the electrical signals at a rate that is relatively high compared to the range of possible time periods corresponding to the varying sample times 105. The higher sampling rate may be, for example, around 400 kHz, to produce high resolution raw data. The raw data may be resampled at a variable lower rate, such as 8 kHz, to generate the sample values 104 described above. The resampling may be performed at a variable rate, such as 8 kHz+/−10-20%. Therefore, in the context of this description, sampling or acquiring sample data can mean either sampling electrical signals directly, or sampling raw data. The latter approach in which the raw data is sampled is straightforward to implement in post-processing of the captured data, and allows the rate at which raw data samples are taken to be set (and, at least in some embodiments, varied) at a level at which they will not contribute to noise, for example. The specific higher sampling rates and resampling rates are given as examples only, and may be selected by the skilled person depending upon implementation and desired performance.

The raw sample data may be filtered, for example to remove high frequency noise from the measurements or to reduce electrical switching noise originating from the IGBTs 14a, 14b.

Finite impulse response filters have been found to be particularly effective for this purpose. Once the raw sample data has been filtered, the filtered data may be sampled at a lower, varying rate.

Instead of storing the raw data for subsequent sampling, it is also possible to sample a signal produced by filtering the raw sample data directly. In this approach, the filtered signal is considered to be the 'raw sample data'.

The terms "incrementing" and "decrementing" refer to changes in relative positions indicated by a counter (or a pointer or memory address, if an explicit counter is not used). In some implementations, the counter may be designed to count down rather than up. In that case, "incrementing" means changing the counter value so that it refers to an address that contains a newer sample value and/or sample time, while "decrementing" means changing the counter value so that it refers to an address that contains an older sample value and/or sample time. Where the counter is designed count down rather than up, for example, "increment" may mean to reduce a value of the counter, and "decrement" may mean to increase the value of the counter. Similarly, to "increment" and "decrement" need not strictly require a unitary increase or decrease in a value of the counter. The counter may be incremented by any suitable value or values that achieve the required outcome.

Figure 6:
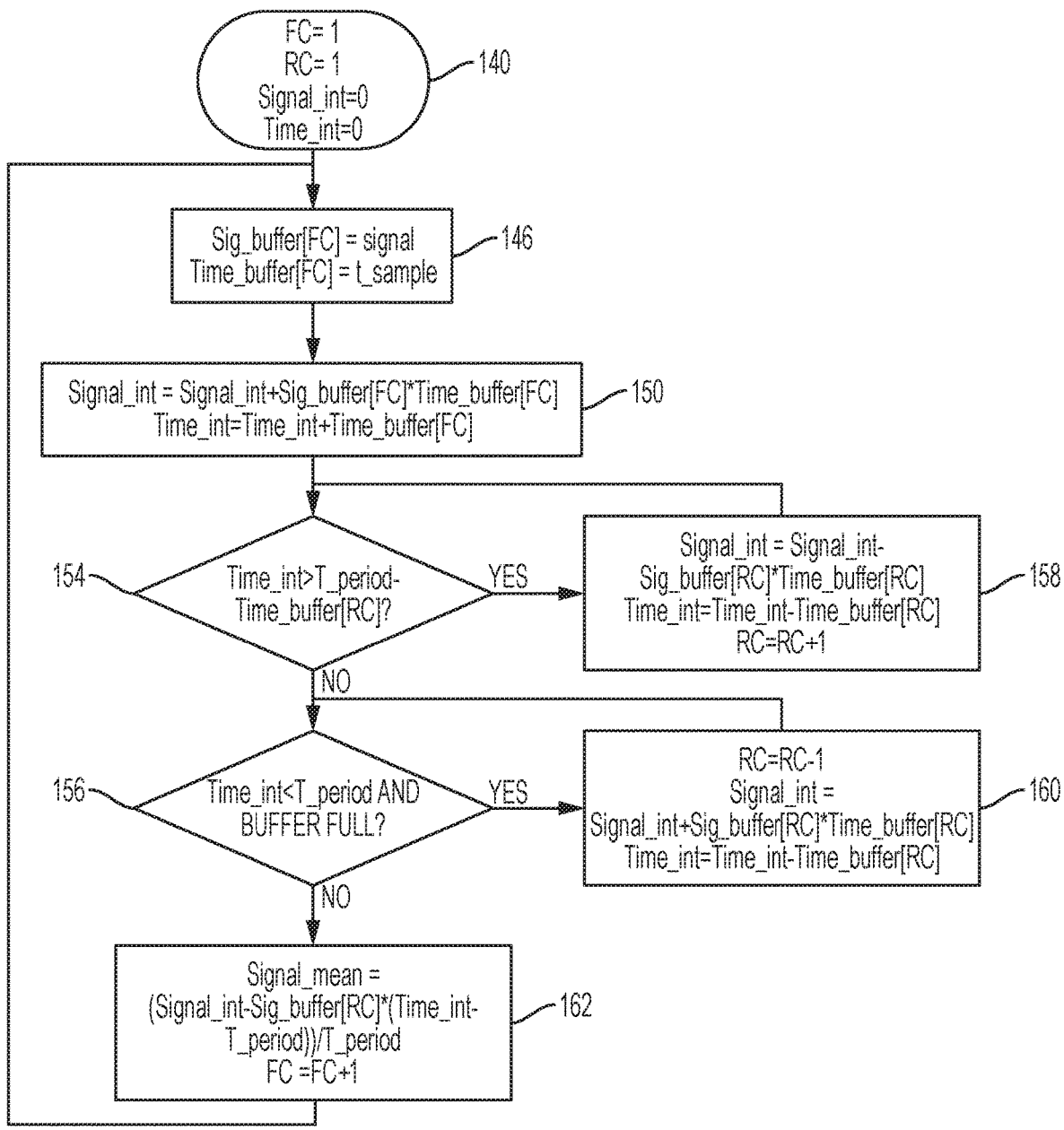
FIG. 6 is a flowchart showing steps of a further embodiment of the invention.
Figure 8:
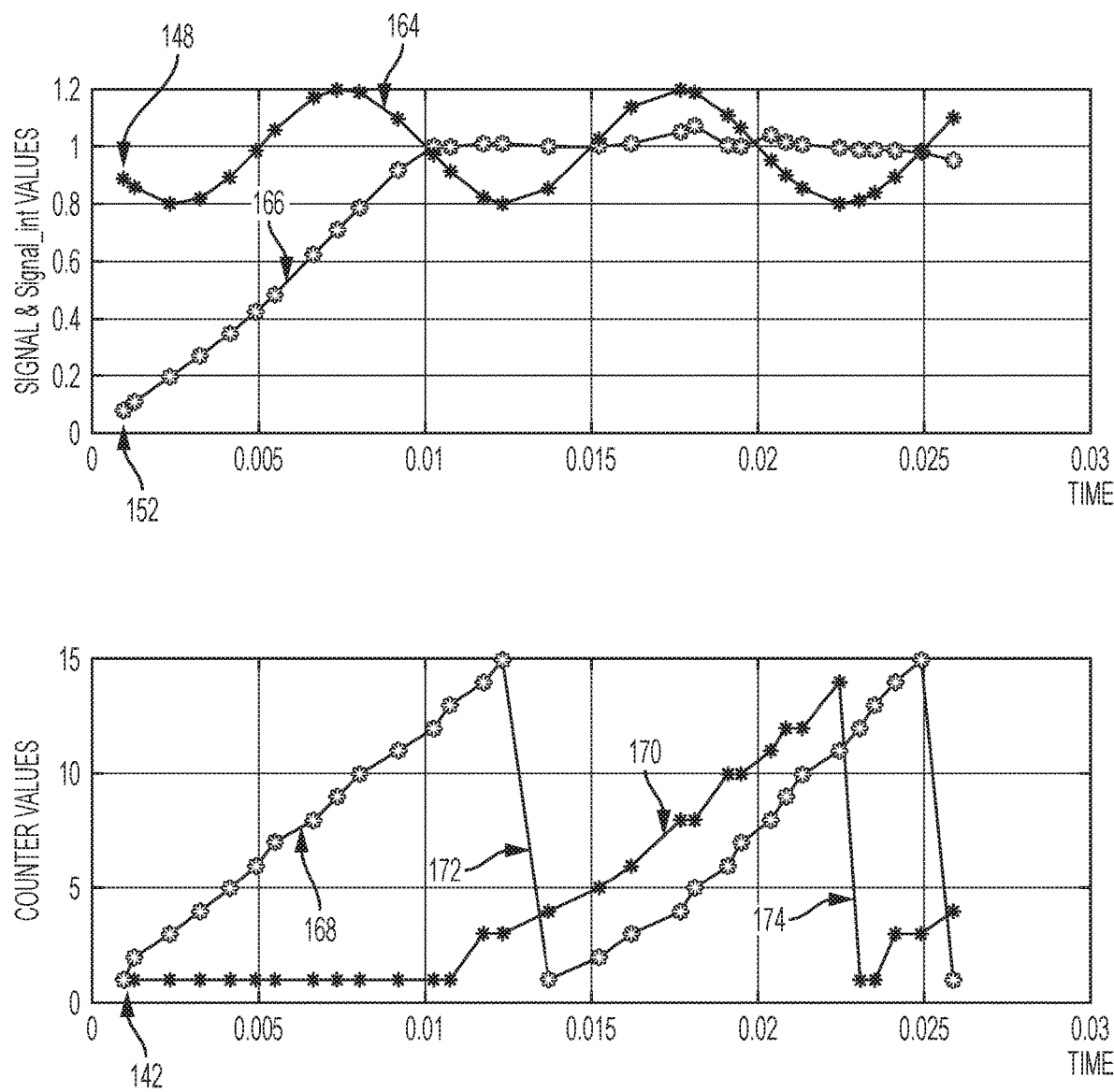
FIG. 8 shows a waveform representing an alternative electronic signal of a wind turbine, along with front and rear counter values.

Turning to FIGS. 6 and 8, there is shown an alternative embodiment of the invention. FIG. 6 is a flowchart showing the steps involved in implementing this embodiment. In an initialisation step 140, values of a front counter FC and rear counter RC are initialised to 1. This means they are pointing at the same address (the first) in corresponding circular signal and time buffer. It will be appreciated that the front and rear counters can be initialised to any suitable values, as the difference between the counter values is what is important, and this will converge to lie within a stable range over time. The initialisation values are indicated at point 142 in FIG. 8.

The values of a signal integrator Signal_int and a time integrator Time_int are initialised to zero. Again, it will be appreciated that other initialisation values may be chosen for each of these integrators. For example, a value may be chosen for each of them that falls within a typical steady state operating range.

In step 146, the signal buffer address indicated by the current value of the front counter, FC, is loaded with the current sample value (Sig_buffer[FC]=signal). The current sample value is indicated by reference sign 148 in FIG. 8, and is approximately 0.9 in this example. The time buffer address indicated by the current value of the front counter, FC, is loaded with the time period associated with the current sample value. This is the time elapsed from the start of the period (time zero, in FIG. 8) to when the current sample 148 is taken.

In step 150, the signal integrator, Signal_int, is updated by adding to it the signal contribution of the current sample. This involves taking the current value of Signal_int (initially zero) and adding to it the current signal value weighted by the current time buffer value (Signal_int=Signal_int+ Sig_buffer[FC]*Time_buffer[FC]). This updated value of Signal_int is indicated by reference 152 in FIG. 8. The time integrator, Time_int, is similarly updated by adding to it the time period associated with the current sample 148 (Time_int=Time_int+Time_buffer[FC]).

In step 154, the value of the time integrator, Time_int, is compared with the length of the waveform period (T_period) being considered minus the time period (Time_buffer [RC]) stored in the time buffer at the address indicated by the rear counter, RC. In this case, Time_int is clearly smaller than [T_period−Time_buffer[RC]], so the answer is "no" and the flowchart moves to step 156 described below.

When sufficient sample values and corresponding time periods have been added to the respective buffers, there will come a point at which the answer to the evaluation in step 154 will be "yes". When that happens, the flowchart moves to step 158, in which the time and signal integrators are updated to remove from consideration the oldest sample value (Signal_int=Signal_int−Sig_buffer[RC]*Time_buffer [RC]) and corresponding time period (Time_int=Time_int− Time_buffer[RC]). The rear counter RC is incremented by 1 (RC=RC+1). The effect of this update is to reduce the number of sample values being considered, and hence to reduce the sum of the corresponding time periods. At this point, the flowchart returns to step 154 where the evaluation is repeated. The loop out to step 158 is repeated until the answer to the evaluation of step 154 is "no", at which point the flowchart moves to step 156.

In step 156, the value of the time integrator, Time_int, is compared with the length of the waveform period (T_period) and also the current length of the buffer. This is to ensure that as many sample values as possible are included in the estimate calculations without exceeding the length of the waveform period. Where there are too few samples being considered (eg, the situation in FIG. 7 where the rear counter points to sample value 135), the answer to this evaluation will be "yes", and the flowchart will move to step 160.

In step 160, the rear counter RC is first decremented by 1 (RC=RC−1). The signal integrator is updated to take into consideration the next oldest sample value (Signal_int=Signal_int+Sig_buffer[RC]*Time_buffer[RC]) and the time integrator is updated to take into consideration to corresponding time period (Time_int=Time_int−Time_ buffer[RC]). The effect of these updates is to increase the number of sample values being considered, and hence to increase the sum of the corresponding time periods. At this point, the flowchart returns to step 156 where the evaluation is repeated. The loop out to step 160 is repeated until the answer to the evaluation of step 156 is "no", at which point the flowchart moves to step 162.

It will be appreciated that the order of steps 154 and 156 (and their corresponding loops) may be swapped.

In step 162, a characteristic of the electrical signal is estimated by dividing the signal integrator (Signal_int) by the period of the waveform (T_period). In the example shown in FIG. 8, a further component (Sig_buffer[RC]* (Time_int−T_period)) is included in the determination of step 162, to take into account the fact that Time_int may not be equal to T_period. This further component pads out the time period for which there is presently no contributing sample value by adding a fraction of the oldest sample value that is being considered (ie, the sample value at the address indicated by the rear counter). As described above, there are other ways of reducing any error associated with this missing period, and in some cases (eg, where high sampling rates are used) it may not be worth correcting for.

The upper plot in FIG. 8 shows how an estimate 166 of a characteristic of a signal 164 changes over the signal's first two full cycles. Initially, the estimate is zero. As the number of sample values being summed increases, the estimate 166 increases until it approaches a relatively stable value around time 0.01.

The lower plot in FIG. 8 shows how the front counter value 168 increments with each new signal value, while the rear counter value 170 only increments when required. Although not shown in this example, the rear counter may also decrement in certain circumstances (ie, as described in relation to steps 156 and 160 above). The lower plot of FIG. 8 also shows the circular nature of the buffers. The front counter value 168 wraps 172 from 15 back 1 between time 0.01 and 0.015. The rear counter value 170 similarly wraps 174 from 14 back to 1 between time 0.02 and 0.025. The value of 15 is skipped in this case because it was necessary to increment the rear counter twice to bring the value of the time integrator (Time_int) back within the waveform period.

All of the alternatives and options described in relation to other embodiments apply to the fullest extent possible to the embodiment of FIGS. 6 and 8, and vice versa.

As described in relation to an earlier embodiment, if Signal_int and Time_int are implemented as floating point data types, a lack of accuracy may occur due to the recursive nature of the calculations. To avoid this, the integrators may be implemented as integer types with appropriate scaling. Alternatively, the summation may be implemented with floating point data types using an algorithm that keeps track of, and corrects for, rounding errors due to the floating point calculations. An example of such an algorithm is Kahan summation.

Although the embodiments above describe that the front counter increments with each new signal value, in some embodiments it may be desirable to reduce the amount of processing by only allowing limited iterations of rear counter updates. For example, the rear counter may only be allowed to increment a particular number times, such as twice, for each new sample value that is acquired, even where the flowchart of FIG. 6, for example, would require a greater number of increments to satisfy the evaluation of step 154. Alternatively, or in addition, the rear counter may be constrained from decrementing in some embodiments. These embodiments trade accuracy against processing time in a manner that will be understood by the skilled person.

The skilled person will understand that any type of integration suited to the characteristic being estimated for the electrical signal may be used with embodiments of the invention.

FIGS. 9A to 9E show some application examples.

Figure 9A:
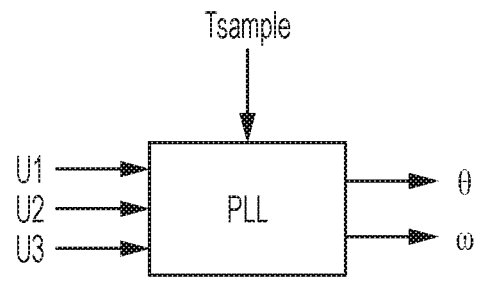
FIGS. 9A-9E are schematic views showing example implementations of aspects of the invention.

FIG. 9A shows a PLL taking sample values Tsample as an input, and outputting a phase θ and a frequency ω. This information can be used in the following examples.

Current control during unsymmetrical grid conditions requires decomposition of voltage and current into a positive and a negative sequence component. For example, the German grid code [VDE-AR-N 4120 Anwendungsregel: 2015-01 Technische Bedingungen für den Anschluss and Betrieb von Kundenanlagen an das Hochspannungsnetz (TAB Hochspannung)] requires individual droop control for positive and negative sequence reactive currents during grid faults.

Figure 9B:
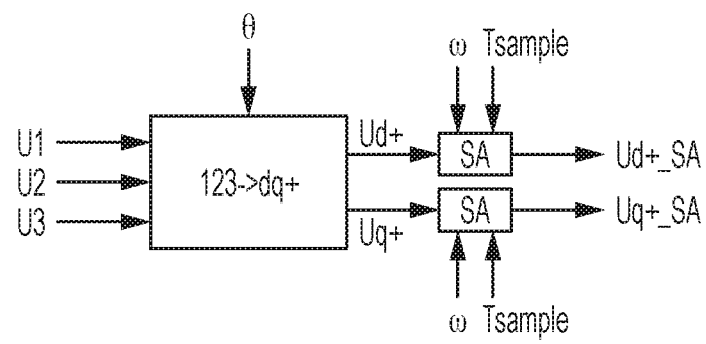

To derive a positive sequence of a signal, a dq transformation may be performed as shown in FIG. 9B, based on the phase output θ of the PLL in FIG. 9A. The negative sequence is removed from the signals by sending the d– and the q quantity through the sliding average (SA) filter with a length that is half of the period corresponding with the grid frequency. In this and the example shown in FIG. 9C, the value of the time integrator 112 is compared with the length of the sliding average filter (SA). In the FIGS. 9B and 9C embodiments, that length is half the grid period, as compared with a full waveform period as described in the embodiments above.

Figure 9C:
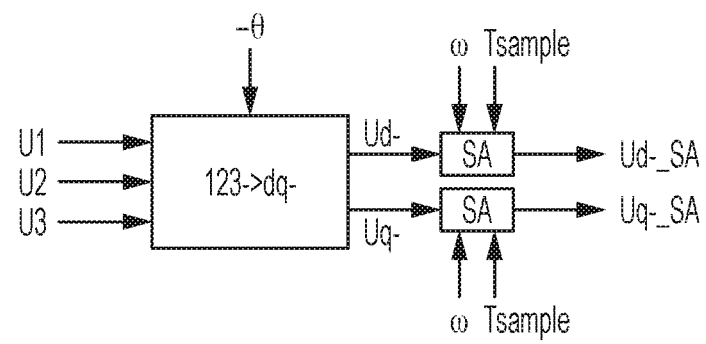

As shown in FIG. 9C, the negative sequence may be derived in a similar way, except that the phase angle used for the dq transformation is of opposite sign.

Figure 9D:
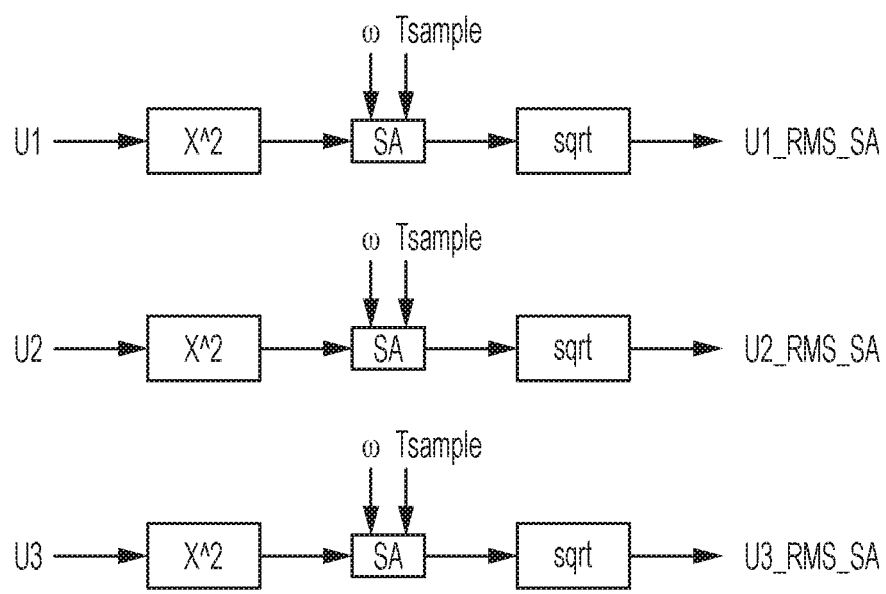

For many applications, such as protection, power and energy calculations, Root Mean Square (RMS) voltages and currents are required. The RMS value of a phase voltage or current is derived by squaring the phase signal and filtering the output through a sliding average filter with a length that is at least half the period corresponding with the grid frequency, as shown in FIG. 9D.

Figure 9E:
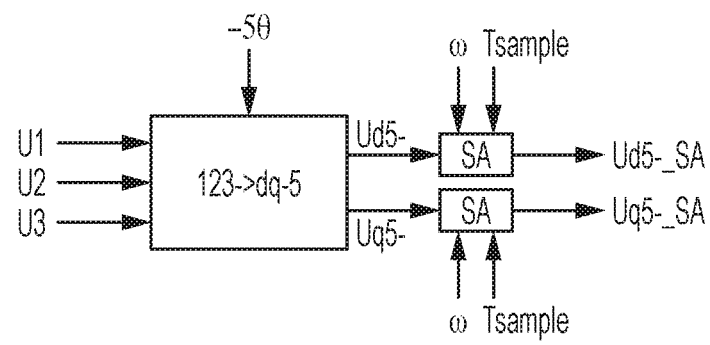

Many grid codes specify limits for harmonic current and voltage distortion. Monitoring and active damping of harmonic voltages and currents require corresponding calculations. FIG. 9E shows, as an example, how the negative sequence $5^{th}$ harmonic voltage may be derived. The length of the sliding average filter is the same as the period corresponding with the grid frequency. The skilled person will appreciate that other harmonics can be estimated in a corresponding manner.

Although the examples of FIGS. 9A-9E involve voltage estimates, the skilled person will understand that similar principles can be applied to current estimates.

The skilled person will appreciate that modifications may be made to the specific embodiments described above without departing from the inventive concept as defined by the claims.

The invention claimed is:

1. A method of estimating a characteristic of an electrical signal of a wind turbine, the method comprising:
   buffering a sequence of sample values of the wind turbine electrical signal in one or more buffers;
   buffering a sequence of sample times corresponding with the sequence of sample values in the one or more buffers, wherein time periods represented by the sample times are variable;
   determining a sub-sequence of the buffered sample values to integrate by:
      updating a time integrator by adding to a value of the time integrator a time period represented by a sample time of the sequence of sample times; and
      until a value of the time integrator is less than or equal to an integration period, repeatedly (i) removing an oldest sample value and corresponding oldest sample time from the one or more buffers and (ii) subtracting the time period corresponding to the oldest sample time from the time integrator; and
   estimating the characteristic by integrating the sample values in the sub-sequence.

2. The method of claim 1, wherein the time periods represented by the sample times vary randomly, pseudo-randomly, or in accordance with a predetermined pattern.

3. The method of claim 1, wherein integrating the sample values in the sub-sequence comprises weighting each of the sample values within the sub-sequence based on a time period corresponding to that sample value's sample time.

4. The method of claim 1, wherein:
   buffering the sequence of sample values and corresponding sample times comprises repeatedly:
      determining one of the sample values, and determining a sample time corresponding with the determined one of the sample values; and
      adding the determined one of the sample values and the corresponding sample time to the one or more buffers.

5. The method of claim 1, wherein the sub-sequence of the sample values to integrate is determined such that a sum of the time periods represented by the sample times associated with the sub-sequence is maximised without exceeding the integration period.

6. The method of claim 1 performed over several integration periods, wherein the integration period is variable.

7. The method of claim 1, further comprising maintaining a forward pointer indicative of a position, in the one or more buffers, of a latest sample value and a latest sample time.

8. The method of claim 7, further comprising maintaining a rear pointer indicative of a position, in the one or more buffers, of a rear sample value and a rear sample time, the rear sample value being older than the latest sample value and the rear sample time being older than the latest sample time.

9. The method of claim 1, wherein the one or more buffers is a circular buffer.

10. The method of claim 1, wherein the one or more buffers is at least as long as a ratio of a longest possible integration period and a shortest possible time period.

11. The method of claim 1, wherein the wind turbine electrical signal that is sampled is one of: a current output from an electrical generator of the wind turbine; a current output from a power converter of the wind turbine; a grid current; a voltage output of the electrical generator; a voltage output of the power converter; and a grid voltage.

12. The method of claim 1, wherein the characteristic is one of the following: positive or negative sequence voltages for use in control of a power converter of the wind turbine; an RMS voltage or current or power of a fundamental frequency of the power converter or an electrical generator of the wind turbine; and an RMS voltage or current or power of a harmonic frequency of the power converter of the electrical generator.

13. The method of claim 1, wherein each sample value includes a combination of any one or more of:
   a combination of one or more scaled sample values;
   a combination of one or more filtered sample values;
   a combination of one of more quantised sample values; and
   a combination of one or more processed sample values.

14. A method of estimating a characteristic of a wind turbine electrical signal, the method comprising:
   (i) sampling a wind turbine electrical signal to determine a sample value;
   (ii) buffering the sample value, and a sample time associated with the sample value, at one or more buffer addresses of one or more buffers, the one or more buffer addresses being based on a value of a front counter;
   (iii) adding, to a time integrator, a time period associated with the sample time, the time integrator representing a total of the time periods associated with a sub-sequence of buffered sample values, the sub-sequence being defined by a buffer address based on the value of the front counter and a buffer address based on a value of a rear counter;
   (iv) adjusting a value of the rear counter to adjust a length of the sub-sequence and updating the time integrator in dependence on the adjusted value of the rear counter;
   (v) integrating the sample values in the sub-sequence;
   (vi) incrementing the front counter; and
   (vii) repeating steps (i)-(vi);
   wherein time periods associated with sample times associated with the samples values in the sub-sequence are variable.

15. The method of claim 14, wherein integrating the sample values in the sub-sequence includes maintaining a sample integrator comprising a sum of sample values corresponding to the sub-sequence.

16. The method of claim 14, wherein the one or more buffers are circular.

17. The method of claim 14, wherein:
adjusting the rear counter comprises adjusting the value of the rear counter to reduce the length of the sub-sequence; and
updating the time integrator in dependence on the adjusted value of the rear counter comprises subtracting, from the time integrator, the time period associated with a sample value that is removed from the sub-sequence as a result of adjusting the rear counter.

18. The method of claim 14, wherein:
adjusting the rear counter comprises adjusting the value of the rear counter to increase the length of the sub-sequence; and
updating the time integrator in dependence on the adjusted value of the rear counter comprises adding, to the time integrator, the time period associated with a sample value that is added to the sub-sequence as a result of adjusting the rear counter.

19. A system, comprising:
a wind turbine, comprising:
   a tower;
   a nacelle disposed on the tower;
   a generator disposed in the nacelle;
   a rotor mechanically coupled to the generator and extending from the nacelle;
   a plurality of blades disposed on the rotor; and
an apparatus for estimating a characteristic of an electrical signal from the wind turbine, the apparatus comprising:
   at least one processor; and
   a memory operatively coupled to the at least one processor, the memory storing instructions that, when executed, causes the at least one processor to perform an operation, comprising:
      buffering a sequence of sample values of the wind turbine electrical signal;
      buffering a sequence of sample times corresponding with the sequence of sample values, wherein the time periods represented by the sample times are variable;
      determining a sub-sequence of the buffered sample values to integrate by:
         updating a time integrator by adding to a value of the time integrator a time period represented by a sample time of the sequence of sample times; and
         until a value of the time integrator is less than or equal to an integration period, repeatedly (i) removing an oldest sample value and corresponding oldest sample time from the one or more buffers and (ii) subtracting the time period corresponding to the oldest sample time from the time integrator; and
      estimating the characteristic by integrating the sample values in the sub-sequence.

* * * * *